United States Patent [19]

Youtsey et al.

[11] 3,940,509

[45] Feb. 24, 1976

[54] SEMI-CONDUCTING MATERIALS AND A METHOD FOR THE MANUFACTURE THEREOF

[75] Inventors: Karl J. Youtsey, Chicago; William C. Holt, Jr., Prospect Heights, both of Ill.

[73] Assignee: Universal Oil Products Company, Des Plaines, Ill.

[22] Filed: Dec. 19, 1973

[21] Appl. No.: 426,280

[52] U.S. Cl. .................. 427/82; 427/122; 427/215; 427/220; 427/221; 427/228; 427/249; 427/255; 427/384; 427/385; 252/500; 252/502

[51] Int. Cl.² ........................ H01L 3/24; B05D 5/12

[58] Field of Search ........ 117/226, 100 B, 216, 217, 117/46 CB, 46 CG, 119.2, 119; 252/502, 503, 500; 338/307; 427/122, 82, 215, 220, 228, 249, 255, 384, 385, 221

[56] References Cited

UNITED STATES PATENTS

| | | | |
|---|---|---|---|
| 3,027,278 | 3/1972 | Reick | 117/226 |
| 3,651,386 | 3/1972 | Youtsey | 317/237 |
| 3,682,759 | 8/1972 | Beutler | 117/119.2 |
| 3,775,078 | 11/1973 | Elmer | 117/46 CB |
| 3,808,045 | 4/1974 | Knyazhez | 117/216 |
| 3,811,916 | 5/1974 | Russell | 117/100 B |
| 3,826,707 | 7/1974 | Olcott | 117/119 |

*Primary Examiner*—Michael F. Esposito
*Attorney, Agent, or Firm*—James R. Hoatson, Jr.; Raymond H. Nelson; William H. Page II

[57] ABSTRACT

Semi-conducting materials which may be used in preparing resistors may be prepared by treating a refractory oxide with a pyrolyzable organic compound at an elevated temperature and thereafter further treating the resultant semi-conducting pyropolymeric inorganic refractory oxide composite material at an elevated temperature with subsequently controlled cooling rate to provide a material which possesses a lower resistivity and a controllable temperature coefficient of resistance over a wide range.

10 Claims, No Drawings

SEMI-CONDUCTING MATERIALS AND A METHOD FOR THE MANUFACTURE THEREOF

This invention relates to semi-conducting pyropolymeric inorganic refractory oxide materials and more specifically to semi-conducting pyropolymeric inorganic refractory oxide materials which possess a desirable temperature coefficient of resistance.

All resistive materials exhibit changes in resistance with changes in temperature to a greater or lesser extent. This is of particular importance when the resistive device may be subjected to a wide variance of temperature such as being used at a temperature up to about 100° C. or down to about 0° C. The resistors which are formed may possess a wide variety of temperature coefficients of resistance. The aforesaid temperature coefficient of resistance is, to some extent, a measure of quality for resistors, i.e., whether they be expensive or inexpensive to manufacture. The temperature coefficient of resistance is defined as the change in resistance per unit resistance for a given change in temperature in °C., a standard unit for this quantity of change being designated by ppm/° C. In many instances, expensive precision resistors will have a range of values extending from 10 to 50 ppm/° C., examples of these precision resistors being wire-wound or metal film resistors. On the other hand, in inexpensive resistors the range of value may extend up to several thousand ppm/° C., examples of these inexpensive resistors comprising carbon film resistors.

It is therefore an object of this invention to provide a method of manufacturing an inexpensive material, such as that which is used in composition resistors, which will possess a superior temperature coefficient of resistance similar to that which is found in the precision resistors.

A further object of this invention is to provide a semi-conducting pyropolymeric inorganic refractory oxide material which is inexpensive in cost and which will possess a range of controlled values of temperature coefficient of resistance.

In one aspect an embodiment of this invention resides in a method of manufacturing a semi-conducting pyropolymeric inorganic refractory oxide material which comprises treating a refractory oxide with a pyrolyzable organic compound at a temperature in the range of from about 400° to about 800° C. whereby a mono-layer of carbonaceous pyropolymer is formed on the surface of said refractory oxide, thereafter further treating the resultant semi-conducting pyropolymeric inorganic refractory oxide material in an inert atmosphere at a temperature in the range of from about 700° to about 1200° C., and recovering the resultant semi-conducting pyropolymeric inorganic refractory oxide material which possesses a temperature coefficient of resistance in a range of from about −20,000 to about +20,000 ppm/° C. as a function of the cooling rate.

A specific embodiment of this invention is found in a method for manufacturing a semi-conducting pyropolymeric inorganic refractory oxide material which comprises treating alumina with cyclohexane at a temperature in the range of from about 400° to about 800° C. whereby a mono-layer of carbonaceous pyropolymer is formed on the surface of said alumina, thereafter further treating the resultant semi-conducting pyropolymeric inorganic refractory oxide material in an inert atmosphere at a temperature in the range of from about 800° C. to about 1200° C. and recovering the resultant semiconducting pyropolymeric inorganic refractory oxide material which possesses a temperature coefficient of resistance in a range of from about +25 to about −25 ppm/° C.

Other objects and embodiments will be found in the following further detailed description of the present invention.

As hereinbefore set forth the present invention relates to a method for manufacturing a semi-conducting pyropolymeric inorganic refractory oxide material which possesses a controlled temperature coefficient of resistance. Heretofore, it has been known in the prior art that resistors may be prepared by utilizing a resistor ink or other resistive material such as a carbon or graphite. However, the use of carbon black or graphite in a resistor has a number of disadvantages, among them being: (a) the rheological properties of inks formed utilizing carbon black or graphite as a pigment are highly variable because of the variety of formulations required to produce a series of resistance values, (b) the electronic performance characteristics vary for the various formulations for the same reason, and (c) batch to batch reproducibility of a given formulation is poor because of the variability of carbon black and graphite properties. As hereinbefore set forth this is of particular importance inasmuch as when an electrical component system is operated over a wide range of temperature environments such as being operated at temperatures below 0° C. or above 100° C. it is an advantage to have a stability of the specifications for the circuit system. In order to effect the stability, it is necessary that the temperature coefficient of resistance be within a relatively narrow range.

The disadvantages which have been hereinbefore enumerated may be eliminated by utilizing a semi-conducting pyropolymeric inorganic refractory oxide material which has been manufactured in a manner hereinafter set forth in greater detail either per se or as the pigment of an electrical resistor ink. By utilizing a pigment in an ink which comprises the semi-conducting pyropolymeric inorganic refractory oxide material, it is possible to obtain resistors in which the temperature coefficient of resistance values will vary over a relatively narrow range. The resistance values of the resistor prepared from an ink containing the desired semi-conducting pyropolymeric inorganic refractory oxide material is determined by selecting the resistivity of the oxide material and not by controlling the volume concentration of the resistive pigment in the vehicle, as in the case of carbon black or graphite inks. By having a constant and optimum volume concentration of the oxide material in the primary vehicle for all resistance values, it is possible to insure uniform rheological properties for screening purposes. Another advantage of utilizing the electrical resistor inks prepared from semi-conducting pyropolymeric inorganic refractory oxide material which is manufactured according to the process of the present invention is that there will be inherently lower current noise in the resulting resistors as contrasted with the noise level found when utilizing resistors based solely on carbon or graphite. In addition, there is no requirement for electrical lead attachments, and the inks, when dried, are easily trimmed by conventional laser and/or abrasive trimming techniques. Yet another advantage of utilizing the electrical resistor inks of the present invention is that the curing of the ink formulations can be effected at room temperature or can be air or oven dried if desired.

Electrical resistor inks may find a wide variety of uses in the electrical field. For example, one application of resistor inks is to produce direct substitutes for discrete resistors in all types of electrical circuits, a particularly advantageous use being in connection with laminated printed circuit boards. The electrical resistor ink can be applied to either side of the circuit board, that is, the component side or the foil side, prior to the final soldering step in which discrete components are electrically attached. In addition, either single- or multi-layered circuit boards are suitable. For example, in the latter case, where multiple layers of circuits are involved, direct incorporation of the printed resistors in the layers provides an obvious benefit in lowering component densities where discrete components must be attached, thus resulting in a significant saving of space. In addition to the use hereinbefore described in laminated printed circuit boards the electrical resistor ink can be used to produce radiant heating panels for use in building construction in which the ink is applied to an inner sheet of panel prior to final lamination; coating an insulating fiber; as an anti-static spray to protect surfaces from static charge accumulation or as window defrosters in which the electrical resistor ink is applied in the form of a fine line to a window surface and after drying will act as a heating element. It is therefore readily apparent that the uses of an electrical resistor ink of the type hereinafter set forth in greater detail are widely varied and therefore an electrical resistor ink which possesses certain advantageous properties will be very desirable. The term "ink" as used in the present specification will refer to a liquid composition which may be used in the form of an ink such as a paste, paint, etc. The ink will comprise a semi-conducting pyropolymeric inorganic refractory oxide material prepared in a manner hereinafter set forth in greater detail and which will possess a temperature coefficient of resistance value within a relatively narrow range in a vehicle. The vehicle may be a mixture of a synthetic or naturally occurring resin, a binder and a solvent in which the oxide materials are suspended, or may be an oil or a mixture of an oil and a separate binder. In addition, it is also contemplated within the scope of this invention that the ink may also contain added accessories such as anti-skinning agents, drying agents, colored pigments, dryers, waxes, talcs, extending or viscous varnishes, thinners, body gums, shorteners and lengtheners, perfumes, plasticizers, anti-foam compounds, etc.

As previously discussed, prior art inks or paints which contain carbon or graphite as the sole resistive component of the mixture are subject to certain disadvantages. For example, the temperature coefficient of resistance of carbon and graphite is relatively large in magnitude and therefore a resistor resulting from the use of these materials will not possess high stability when subjected to temperature changes. Graphites, both naturally occurring and synthetic in nature, are also subject to these same disadvantages and in addition may possess other disadvantages such as relatively high current noise characteristics. A further disadvantage is in batch to batch non-reproducibility of carbon and graphite ink formulation of ±25 to ±45% of the effective resistance values. By utilizing a semi-conducting pyropolymeric inorganic refractory oxide material of the type hereinafter set forth in greater detail as the resistive component of the finished composition of matter, it is possible to overcome these disadvantages and provide a resistor which is tough, flexible and flake-resistant; will compete cost-wise effectively with discrete carbon resistors while yielding equivalent or superior performance characteristics; will have a relatively low current noise as contrasted with carbon inks, and will also possess a controllable temperature coefficient of resistance and will be stable over a wide range of temperatures.

The semi-conducting pyropolymeric inorganic refractory oxide material may comprise a mono-layer of carbonaceous pyropolymer formed on the surface of a refractory oxide material. The semi-conducting pyropolymeric inorganic refractory oxide material may be prepared by heating an organic compound in the absence of oxygen and passing the pyrolyzable substance over the refractory oxide material in the vapor phase to deposit a carbonaceous pyropolymer thereon. The refractory oxide material which may be used as the base may be in any form such as loose or compacted dry powders, cast or calcined sols, heated sols, substrates in the form of flats, cylinders and spheres, rods, pellets, etc. In the preferred embodiment of the present invention the refractory oxide base will be characterized as having a surface area of from 1 to about 500 square meters per gram. Illustrative examples of the refractory oxides which may be used will include alumina in various forms such as gamma-alumina and silica-alumina. In addition, it is also contemplated that the refractory oxide may be preimpregnated with a catalytic metallic substance such as platinum, platinum and rhenium, platinum and germanium, platinum and tin, platinum and lead, nickel and rhenium, tin, lead, germanium, etc.

Examples of organic substances which may be pyrolyzed to form the pyropolymer on the surface of the aforementioned refractory oxides will include aliphatic hydrocarbons, cycloaliphatic hydrocarbons, aromatic hydrocarbons, aliphatic halogen derivatives, aliphatic oxygen derivatives, aliphatic sulfur derivatives, aliphatic nitrogen derivatives, heterocyclic compounds, organometallic compounds, etc. Some specific examples of these organic compounds which may be pyrolyzed will include ethane, propane, butane, pentane, ethylene, propylene, 1-butene, 2-butene, 1-pentene, 2-pentene, 1,3-butadiene, isoprene, cyclopentane, cyclohexane, methylcyclopentane, benzene, toluene, the isomeric xylenes, naphthalene, anthracene, chloromethane, bromomethane, chloroethane, bromoethane, chloropropane, bromopropane, iodopropane, chlorobutane, bromobutane, iodobutane, carbon tetrachloride, chloroform, 1,2-dichloroethane, 1,2-dichloropropane, 1,2-dichlorobutane, ethyl alcohol, n-propyl alcohol, isopropyl alcohol, n-butyl alcohol, sec-butyl alcohol, t-butyl alcohol, glycol, glycerol, ethyl ether, isopropyl ether, butyl ether, ethyl mercaptan, n-propyl mercaptan, butyl mercaptan, methyl sulfide, ethyl sulfide, ethyl methyl sulfide, methyl propyl sulfide, dimethyl amine, diethyl amine, ethyl methyl amine, acetamide, propionamide, nitroethane, 1-nitropropane, 1-nitrobutane, acetonitrile, propionitrile, formic acid, acetic acid, oxalic acid, acrylic acid, formaldehyde, acid aldehyde, propionaldehyde, acetone, methyl ethyl ketone, methyl propyl ketone, ethyl propyl ketone, methyl formate, ethyl formate, ethyl acetate, benzyl chloride, phenol, o-cresol, benzyl alcohol, hydroquinone, resorcinol, catechol, anisole, phenetole, benzladelyde, acetophenone, benzophenone, benzoquinone, benzoic acid, phenyl acetate acid, hydrocinnamic acid, furan, furfural, pyran, coumarin, indole, carbohydrate derivatives such as sugars including dextrose, fructose, sucrose, starches, etc. It is to be understood that the aforementioned compounds are only representative of the class of compounds which may undergo pyropolymerization and that the present invention is not necessarily limited thereto.

As hereinbefore set forth the aforementioned organic compounds are admixed with a carrier gas such as nitrogen or hydrogen, heated and thereafter passed over the refractory oxide base of the type hereinbefore set forth. The deposition of the propolymer on the surface of the base is effected at relatively high temperatures ranging from about 400° to about 800° C. and preferably in a range of from about 600° to about 750° C. It is possible to govern the electrical properties of the semi-conducting pyropolymeric inorganic refractory oxide material by regulating the temperature and residence time during which the refractory oxide base is subjected to the treatment with the organic pyrolyzable substance. The thus prepared semi-conducting pyropolymeric inorganic refractory oxide material when recovered will possess a resistivity in the range of from about $10^{-2}$ to about $10^{8}$ ohm-centimeters.

The semi-conducting pyropolymeric inorganic refractory oxide material when recovered from the first stage of the process of the present invention will possess a negative temperature coefficient of resistance. In order to obtain a semi-conducting pyropolymeric inorganic refractory oxide material which possesses a positive temperature coefficient of resistance within the range from about +25 to about +20,000 ppm/° C., it is necessary to subject the semi-conducting pyropolymeric inorganic refractory oxide material to further treatment. This further treatment consists of subjecting the semi-conducting pyropolymeric inorganic refractory oxide material to further heating in an inert atmosphere at a temperature in the range of from about 700° to about 1200° C. followed by a rapid cooling which is also referred to as a quench. The second heating step may be effected in various ways. For example, the semi-conducting pyropolymeric inorganic refractory oxide material may be cooled after the first heating stage prior to being reheated. The cooling must be accomplished in a rapid manner by subjecting the semi-conducting pyropolymeric inorganic refractory oxide material after the first heating step to a quench by being removed from the heater into the atmosphere or by being passed into liquid nitrogen. Alternatively, the semiconducting pyropolymeric inorganic refractory oxide material may be subjected to a slow cooling or annealing step in which a slow decrease of $\Delta$ T (temperature differential) is accomplished over a period which will range from about 0.5 up to about 24 hours resulting in a product with a negative temperature coefficient of resistance. Upon completion of the second heating and quenching step, which will raise the temperature coefficient of resistance from a negative value up to zero or a positive temperature coefficient of resistance within the range hereinbefore set forth, the material is recovered and utilized in a manner hereinafter set forth in greater detail.

As an alternative process, it is also contemplated within the scope of this invention that the second heating stage of the process may be effected in a continuous manner after the first heating step has been accomplished. This is effected by placing the semi-conducting pyropolymeric inorganic refractory oxide material in a second heating zone or by raising the temperature in the first heating zone to the aforementioned range. The two heating stages may be effected on the semi-conducting pyropolymeric inorganic refractory oxide material which is in the form of a powder or, if so desired, the powder which results from the first heating stage may be formed into a desired shape and thereafter subjected to heating at the elevated temperature in the second stage of the process.

While the aforementioned discussion has been centered on the use of a single semi-conducting pyropolymeric inorganic refractory oxide material to be used in a resistor, it is also contemplated within the scope of this invention that a semi-conducting pyropolymeric inorganic refractory oxide material which results from the two-step process of the present invention and which will possess a positive temperature coefficient of resistance may be blended with the semi-conducting pyropolymeric inorganic refractory oxide material which has only been subjected to a first stage pyrolysis reaction, this material possessing a negative temperature coefficient of resistance, and thus the resulting material when thoroughly admixed will possess a temperature coefficient of resistance near zero.

The semi-conducting pyropolymeric inorganic refractory oxide material which has been prepared according to the two-step process of the present invention or which is admixed with another semi-conducting pyropolymeric inorganic refractory oxide material which has been prepared in only a single-step process, the mixture of the two materials having a desired temperature coefficient of resistance may be admixed with other components which make up the final electrical resistor ink. These other components will act as a medium in which the semi-conducting pyropolymeric inorganic refractory oxide material is carried, and will comprise ingredients which will impart suitable rheological and drying properties to the ink during the application of said ink and desirable physical and electrical properties to the resistor after the ink has set. The suitable rheological properties are dictated by the particular procedure during the application. For example, if the ink is to be applied by silk screening, the ink must have the pseudoplastic properties of low viscosity at high shear rates and high viscosity at low shear rates. This allowed the ink to be easily passed through the screen and at the same time will prevent an excessive flow after the application. In addition, drying times must be compatible with the application procedure, i.e. must be long enough to prevent equipment fouling but short enough to allow handling and resistor trimming at the earliest possible time. Another important aspect of the formulation of resistive inks is that an electrical continuity must be established between the conductive particles after the ink has dried. Therefore, setting of the ink must involve a certain amount of shrinkage so that the excess vehicle or medium by the inter-particle contact points is eliminated. Vehicles which do not have this shrinking property merely encapsulate the conductive particles and do not produce a suitable resistive material. Furthermore, the vehicle properties which are imparted to the finished product constitute another important aspect of resistive ink formulations. The finished resistor, in addition to adhering firmly to the surface on which it is applied, must also make good electrical contact to conductors on which it is applied as well as being reasonably resistant to abrasion and reasonably mechanically flexible.

Therefore, the medium in which the semi-conducting pyropolymeric inorganic refractory oxide material is carried must meet the aforementioned qualifications. This medium in which the semi-conducting pyropolymeric inorganic refractory oxide material is carried will comprise a binder and a solvent or oil. Examples of binders which may comprise synthetic or naturally occurring compounds will include naturally occurring compounds such as casein, soya bean oil derivatives, shellac, natural rubber, natural resins such as copals, congos, kauris, gum batu, gilsonite, asphaltic pitches, rosin, shellac, gum elemi, mastic, etc. or synthetic compounds including thermoplastic resins such as polystyrene, polyamide, alkyd resins, acrylic esters, cellulose esters and ethers, polyvinyl alcohol derivatives, etc. or thermosetting resins such as phenolic resins, epoxy resin, melamine resins, unsaturated polyesters, vinyl copolymer resins, urea resins, or varnish, etc., the varnish comprising an oil varnish, a spar varnish, a bituminous varnish, etc.; nitrocellulose, ethyl cellulose.

The oils and solvents which comprise the other component of the vehicle are differentiated on the basis of their viscosity. For example, liquids with a viscosity of less than 0.1 poise at 77° F. are classified as solvents while liquids of a viscosity greater than 1.0 poise at 77° F. are classified as oils, liquids with viscosities between the above two values being classified as either solvents or oils by convention. In addition, the oils may be classified into three groups depending upon their drying characteristics, these classes being (1) a drying oil, (2) a semidrying oil, and (3) a non-drying oil. In the preferred embodiment of the present invention the preferred oil which may be used as the vehicle for the ink will comprise a drying oil, although other oils may be used as special ingredients for special purposes such as providing plasticity to the ink. Examples of drying oils which may be used will include linseed oil, tung oil, oiticica oil, perilla oil, dehydrated castor oil, safflower oil, soya bean oil, rosin oil, hempseed oil, poppyseed oil, etc. Semi-drying oils which may be used will include cottonseed oil, rapeseed oil, corn oil, etc. Examples of non-drying oils will include castor oil, peanut oil, olive oil, neatsfoot oil, lard oil, sperm oil, etc. The drying oils may be used as bodying agents, the viscosity of which may be controlled by metal-catalyzed oxidation or thermally-induced polymerization. The solvents which may be used with resin binders and the conductive material may be classified on the basis of their composition, said solvents including hydrocarbon solvents, alcohols, aldehydes, acids, ethers, ketones, glycols and esters. Some specific examples of solvents which may be employed include n-pentane, n-hexane, benzene, toluene, the isomeric xylenes, ethylbenzene, ethyl alcohol, n-propyl alcohol, isopropyl alcohol, n-butyl alcohol, acetaldehyde, propionaldehyde, butyraldehyde, acetic acid, propionic acid, phthalic acid, acetone, methyl ethyl ketone, methyl propyl ketone, methyl isopropyl ketone, methyl isobutyl ketone, ethyl propyl ketone, etc., ethylene glycol diethylene glycol, triethylene glycol, mineral spirits, butyl acetate, amyl acetate, ethylene glycol monoethyl ether acetate, ethylene glycol monobutyl ether, ethylene glycol monoethyl ether, etc.

In addition to the three components hereinbefore set forth, it is also contemplated within the scope of this invention that the electrical resistor ink may also contain other components which will go to make up the finished composition of matter. The other components which are added to the ink will impart certain properties, said components including dryers, plasticizers, anti-skinning agents, waxes such as petroleum waxes, carnauba wax, talcs, perfumes to mask unpleasant odors or to hide the presence of vital ingredients, or a color pigment which may be used for coding purposes. Examples of dryers which may be added include metal powders such as cobalt powder, manganese powder, lead power, or zirconium powder, plasticizers which may be added include soft resins, tributyl phosphate, castor oil; while anti-skinning agents which may be added will include, for example, hydroquinone, catechol, resorcinol, guaiacol, pyrogallol, eugenol, 2,5-di-t-butylhydroquinone, 2-butanone oxime, 2-pentanone oxime, etc. It is to be understood that the aforementioned examples of binders, oils, solvents and additives are only representative of the class of compounds which may be used as components of electrical resistor inks, and that the present invention is not necessarily limited thereto.

The electrical resistor ink may be prepared in any suitable manner. For example, the semi-conducting pyropolymeric inorganic refractory oxide material which had been prepared according to the method hereinbefore set forth, or by any other method known in the art, may be prepared by grinding the material to an appropriate particle size, said particle size being determined by the desired rheological property of the vehicle, and by the requirements for screening, i.e., lines/inch, etc. In the preferred embodiment of the invention the most desired particle size is that which produces a colloidal suspension of the semi-conducting pyropolymeric inorganic refractory oxide material in the vehicle. Generally speaking, the material should possess a particle size of less than 20 microns and preferably particles less than 10 microns are desirable, the optimum size being less than 1 micron. The semi-conducting pyropolymeric inorganic refractory oxide material or mixture of two semi-conducting pyropolymeric inorganic refractory oxide materials is then admixed with the medium by blending with the binder and with the oil or solvent. Alternatively, the semi-conducting pyropolymeric inorganic refractory oxide material will be admixed with the vehicle component such as the solvent and thereafter ground by means of a roll mill, colloidal mill, or ball mill until the particle size previously determined, that is, less than 10 microns, and if so desired, less than 1 micron, is obtained. Following this the components may be thereafter blended with the binder by means of an inverted blender, mill, etc. The semi-conducting pyropolymeric inorganic refractory oxide material may be present in the finished resistor ink in an amount determined by the rheological properties of the ink and the electrical and physical properties of the resistors which result therefrom. Generally speaking, the semi-conducting pyropolymeric inorganic refractory oxide material will be present in the finished electrical resistor ink in an amount in the range of from about 10% to about 95% by weight of the finished composition of matter and preferably in a range of from about 50 to about 90% by weight. As hereinbefore set forth, the electrical resistor ink may also contain other components of the type hereinbefore set forth in greater detail such as preserving agents, color pigments, plasticizers, dryers, etc. these components also being added to the three component mixture of the ink in necessary amounts.

The electrical resistor inks which have been prepared according to the process hereinbefore set forth and which may contain a wide variety of components are formulated for application by any of a variety of methods. Some examples of the way in which the electrical resistor ink may be applied include silk screening, printing, painting, spraying, etc. each application method presenting a different set of rheological conditions which must be met by the particular formulation of the vehicle in which the conductive material is carried. The electrical resistor ink is applied to an appropriate surface such as a printed circuit board in convenient conveniennt manner and upon completion of the drying step will form the desired resistor. The wet inks may be either air dried or taken through a predetermined temperature cycle to produce the finished resistor. The particular temperature which is to be employed in the drying cycle will, of course, be dependent upon the particular formulation of the ink vehicle, i.e., whether the vehicle contains a drying oil, a non-drying oil, a semi-drying oil, a solvent or mixtures thereof and may be adjusted to satisfy the individual requirements. The resistors of the finished product will be a function of the resistivity of the conductive material which is present and also of the geometry of the printed resistor. The adjustment of the final value of the resistor can be effected by trimming the particular resistor using standard techniques such as physically removing some of the resistive material by means of grit blasting or by removal of the material utilizing a laser beam.

The resistor after removal of the solvent or oil will form a material, the surface of which possesses a considerable toughness and strength and will be able to withstand abrasion. Therefore, it is contemplated within the scope of this invention to employ the thus formed resistor as a variable resistor in which the electrical contact may be moved over the surface of said resistor utilizing a sufficient amount of pressure to insure complete contact at all times without changes in the resistance due to wear on the surface of the resistor caused by the aforesaid abrasion. In addition, the thus formed resistor will possess a temperature coefficient of resistance in a range of from about +25 to about +500 ppm/° C., maintaining a relatively constant temperature coefficient when utilized over a wide range of temperatures.

The following examples are given to illustrate various semi-conducting pyropolymeric inorganic refractory oxide materials which may be prepared, and that the present invention is not necessarily limited thereto.

EXAMPLE 1

In this example a semi-conducting pyropolymeric inorganic refractory oxide material was prepared by treating a base comprising 0.75% platinum on a gamma-alumina. This base was placed in a reactor, the temperature of the reactor vessel was raised to 600° C. and a charge comprising cyclohexane in a nitrogen atmosphere was passed over the alumina for a period of 6 hours. At the end of this time, the reaction was discontinued and the semi-conducting pyropolymeric inorganic refractory oxide material was recovered. This material had a resistivity of $3.7 \times 10^6$ ohm-centimeters and a temperature coefficient of resistance of −10,000 ppm/° C.

The semi-conducting pyropolymeric inorganic refractory oxide material which was prepared according to the above paragraph was divided into 4 samples. The first sample was reheated in an inert atmosphere of nitrogen for a period of 4 hours at a temperature of 700° C. and thereafter was quenched by being placed in a room temperature, nitrogen environment immediately after the 4-hour period. This sample was labeled A. A second sample was heated in an identical manner for a period of 2 hours at a temperature of 900° C. and thereafter was quenched by being placed in a room temperature, nitrogen environment, said sample being labeled B. A third sample labeled C was heated to a temperature of 700° C. for a period of 1 hour and likewise quenched. The fourth sample labeled D was heated for a period of 0.25 hours at a temperature of 900° C. and immediately quenched. The four samples all had a reduced resistivity and a positive temperature coefficient of resistance. These resistivities and temperature coefficients of resistance are set forth in Table I below:

TABLE I

| | A | B | C | D |
|---|---|---|---|---|
| Resistivity Ohm-Centimeters | 890 | 50 | 2,000 | 190 |
| Temperature Coefficient of Resistance, ppm/°C. | +700 | +950 | +12,000 | +19,800 |

It is therefore readily apparent from the above table that the resistivity and temperature coefficient of resistance of a semi-conducting pyropolymeric inorganic refractory oxide material can be varied over a relatively wide range by utilizing treatment parameters such as time, temperature and cooling rate, the desired resistivity and temperature coefficient of resistance being dependent upon these variables. The semi-conducting pyropolymeric inorganic refractory oxide material which possesses a positive temperature coefficient of resistance can be admixed with other semi-conducting pyropolymeric inorganic refractory oxide materials which possess a negative temperature coefficient of resistance similar to that which is obtained in the first stage of the process of the present invention and therefore it will be possible, by varying the amounts of the two materials, to obtain a temperature coefficient of resistance near zero, this temperature coefficient of resistance being the most desirable factor.

EXAMPLE II

In a manner similar to that hereinbefore set forth in Example I above, an inorganic refractory base comprising 0.75% Pt on gamma-alumina was placed in a reactor vessel which was thereafter heated to 600° C. and cyclohexane in a nitrogen atmosphere was passed over the gamma-alumina for a period of 6 hours. At the end of this time, heating was discontinued and the resultant semi-conducting pyropolymeric inorganic refractory oxide material was recovered. The thus prepared material was thereafter reheated to a temperature of 700° C. for a period of 4 hours and thereafter slowly cooled during a period of 20 hours to room temperature. The resulting material possessed a resistivity of 5400 ohm-centimeters and a temperature coefficient of resistance of −19,000 ppm/° C.

EXAMPLE III

In this example gamma-alumina is impregnated with a dextrose solution for a period of 2 hours following which the impregnated alumina is dried at a temperature of 105° C. for a period of 2 hours. The dried, impregnated alumina is then pyrolyzed at a temperature of 750° C. for a period of 6 hours. Following this the resultant semi-conducting pyropolymeric inorganic refractory oxide material is reheated to a temperature of 900° C. for a period of 4 hours and thereafter quenched by being exposed to a room temperature nitrogen environment. The resultant semi-conducting pyropolymeric inorganic refractory oxide material will be found to have a resistivity of 15 ohm-centimeters and a temperature coefficient of resistance of +250 ppm/° C.

EXAMPLE IV

A base comprising silica-alumina is placed in a reactor which is thereafter heated to 600° C. Following this toluene in a nitrogen atmosphere is passed over the silica-alumina for a period of 2 hours while maintaining the reactor temperature at 600° C. At the end of this time, heating is discontinued as is the flow of toluene and the semi-conducting pyropolymeric inorganic refractory oxide material is recovered. The desired semi-conducting material is prepared by heating the precursor to a temperature of 1200° C. for a period of 2 hours following with a quench is effected by immediately exposing the semi-conducting pyropolymeric inorganic refractory oxide material to liquid nitrogen. The resultant semi-onducting pyropolymeric inorganic refractory oxide material will be found to have a resistivity of 1.3 ohmcentimeters and a temperature coefficient of resistance of +25 ppm/° C.

EXAMPLE V

In like manner a refractory oxide comprising silica-alumina is treated at a temperature of 600° C. with an organic compound comprising n-pentane in a nitrogen atmosphere. After a period of 6 hours, the pentane flow and heating are discontinued and after cooling the semi-conducting pyropolymeric inorganic refractory oxide material is then reheated to a temperature of 900° C. for a period of 1 hour following which a quench is effected by immediately exposing the material to ice water environment. The resultant semi-conducting pyropolymeric inorganic refractory oxide material will possess a resistivity of 2100 ohm-centimeters and a temperature coefficient of resistance of 100 ppm/° C.

We claim as our invention:

1. A method of manufacturing a semi-conducting pyropolymeric inorganic refractory oxide material which comprises heating a refractory oxide in an oxygen-free atmosphere with a pyrolyzable organic compound at a temperature in the range of from about 400° to about 800°C. for a sufficient time to form a mono-layer of carbonaceous pyropolymer on the surface of said refractory oxide, thereafter further heating the resultant semiconducting pyropolymeric inorganic refractory oxide material in an inert atmosphere at a temperature higher than the firstmentioned temperature and in the range of from about 700° to about 1200°C. for a sufficient time to form a semi-conducting pyropolymeric inorganic refractory oxide material having a temperature coefficient of resistance in a range of from about +20,000 to about −20,000 ppm/°C., and cooling and recovering the last-named material.

2. A method of manufacturing a semi-conducting pyropolymeric inorganic refractory oxide material as set forth in claim 1 in which said material has a temperature coefficient of resistance in a range of from about +25 to about −25 ppm/° C.

3. A method of manufacturing a semi-conducting pyropolymeric inorganic refractory oxide material as set forth in claim 1 in which said material possesses a resistivity in the range of from about $10^{-2}$ to about $10^{8}$ ohm-centimeters.

4. A method of manufacturing a semi-conducting pyropolymeric inorganic refractory oxide material as set forth in claim 1 in which said refractory oxide is a platinum containing gamma-alumina and said pyrolyzable organic compound is cyclohexane.

5. A method of manufacturing a semi-conducting pyropolymeric inorganic refractory oxide material as set forth in claim 1 in which said refractory oxide is gamma-alumina and said pyrolyzable organic compound is benzene.

6. A method of manufacturing a semi-conducting pyropolymeric inorganic refractory oxide material as set forth in claim 1 in which said refractory oxide is gamma-alumina and said pyrolyzable organic compound is dextrose.

7. A method of manufacturing a semi-conducting pyropolymeric inorganic refractory oxide material as set forth in claim 1 in which said refractory oxide is silica-alumina and said pyrolyzable organic compound is toluene.

8. A method of manufacturing a semi-conducting pyropolymeric inorganic refractory oxide material as set forth in claim 1 in which said refractory oxide is silica-alumina and said pyrolyzable organic compound is n-pentane.

9. A method as set forth in claim 1 in which said organic compound is passed over said refractory oxide material in an oxygen-free carrier gas.

10. A method as set forth in claim 9 in which said carrier gas comprises nitrogen or hydrogen.

* * * * *